United States Patent [19]

Tohyama

[11] Patent Number: 4,777,451
[45] Date of Patent: Oct. 11, 1988

[54] DIFFERENTIAL CIRCUIT

[75] Inventor: Kay Tohyama, Kawasaki, Japan

[73] Assignee: Fujitsu Limited, Kawasaki, Japan

[21] Appl. No.: 95,847

[22] Filed: Sep. 14, 1987

[30] Foreign Application Priority Data

Sep. 13, 1986 [JP] Japan ................................ 61-216755

[51] Int. Cl.$^4$ ................................................ H03F 3/45
[52] U.S. Cl. ........................................ 330/253; 330/277
[58] Field of Search ................ 330/252, 253, 260, 261, 330/277

[56] References Cited

U.S. PATENT DOCUMENTS

| | | |
|---|---|---|
| 3,678,407 | 7/1972 | Ahrons . |
| 3,898,477 | 8/1975 | Buchanan . |
| 3,970,951 | 7/1976 | Hoffman . |
| 4,393,315 | 7/1983 | Stickel et al. . |
| 4,563,654 | 1/1986 | Arai et al. ............................ 330/253 |

FOREIGN PATENT DOCUMENTS 0121688 10/1984 European Pat. Off. .

OTHER PUBLICATIONS

Patent Abstracts of Japan, vol. 10, No. 170 (E-412) [2226], Jun. 17, 1986; & JP-A-61 23403 (Hitachi Seisakusho Takashi Sase) 31-01-1986.

*Primary Examiner*—Gene Wan
*Attorney, Agent, or Firm*—Staas & Halsey

[57] ABSTRACT

To increase a voltage gain of a differential circuit, constant current source type FETs in which a source and a gate are short circuited are used as a load element and as a current source. A constant voltage type FET is used as a clamp to clamp the load element. Therefore, a temperature characteristic and a deterioration of an AC characteristic, which cause problems in a conventional diode clamp type differential circuit, can be improved.

7 Claims, 8 Drawing Sheets

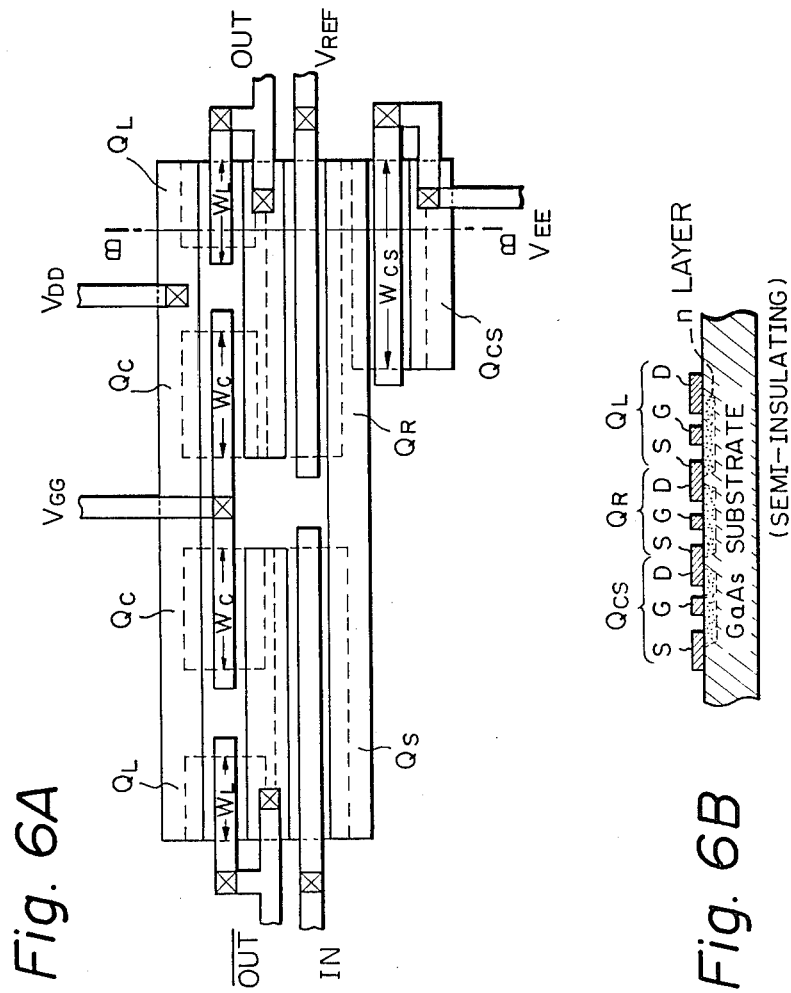

DIFFERENTIAL CIRCUIT

BACKGROUND OF THE INVENTION

1. Field of the Invention

The present invention relates to a differential circuit using a field effect type semiconductor element (FET), and particularly, it relates to a differential circuit mounted on a semiconductor integrated circuit.

2. Description of the Related Art

Hereinafter, the explanation of a differential circuit will be given, as an example, when a gallium arsenic MESFET (metal-semiconductor junction FET) is used.

The basic type of FET differential amplifier circuit is usually formed by transistors as a differential pair, and has load resistors connected between a high potential source and a low potential source.

But, in such a circuit, a sufficient voltage gain cannot be obtained because of the load resistors. Therefore, to improve the voltage gain, it has been proposed to replace the load elements and the current source with a constant current type FET in which a short-circuit is made between the gate and the source.

However, this type of circuit has the following drawbacks:

(1) When an input is high level a current flows into a gate of a driver FET, and if the value of this current is large, a break down of a wire or a deterioration of the Schottky characteristic may occur.

(2) The dependency of a circuit characteristic on an element characteristic is high, and thus the circuit characteristic is easily changed by a variation in the element characteristic.

To solve this problem, it has been proposed that both ends of the load FET be clamped by diodes, to obtain a stable operation.

However, this clamping by the diodes causes other problems, such as:

A large temperature characteristic at the low output level, which occurs because the low output level is determined by a forward ON voltage of the I-V characteristic of the diode; and a deterioration of the AC characteristic because the junction capacitance of the diode becomes a load.

SUMMARY OF THE INVENTION

Therefore, an object of the present invention is to solve the drawbacks of a conventional FET differential circuit, and to provide a differential circuit in which a sufficient voltage gain and a stable operation can be obtained.

This object can be achieved by providing a differential circuit which comprises a first drive FET and a second drive FET each having a gate connected to an input, and the sources of the first drive FET and the second drive FET being commonly connected; a constant current FET being connected between the commonly connected sources of the first drive FET and the second drive FET and a low voltage power source; load circuits being provided between each drain of the first drive FET and the second drive FET and a high voltage power source; each of the load circuits being formed by a first load FET in which a drain is connected to the high voltage power source and a gate and a source are short circuited and connected to a drain of the first drive FET or to a drain of the second drive FET, and a second load FET in which a drain is connected to the high voltage power source, a source is connected to a drain of the first drive FET or a drain of the second drive FET and a constant voltage is applied to a gate; and output terminals being connected to a drain of the first drive FET or the second drive FET.

In the above constitution, the utilization of the FET clamp has the following effects:

(1) The FET clamp does not have a temperature characteristic, unlike a diode.

(2) The capacitance between the drain and the source is added to the load, but this is a very small value when compared with the junction capacitance of the diode, and thus a deterioration of a transient characteristic can be prevented.

Further features and advantages of the present invention will be apparent from the ensuing description with reference to the accompanying drawings to which, however, the scope of the invention is in no way limited.

BRIEF DESCRIPTION OF THE DRAWINGS

FIGS. 6A and 6B are a plan view and a sectional view, respectively of the integrated circuit shown in FIG. 5;

DESCRIPTION OF THE PREFERRED EMBODIMENTS

Figure 1A:
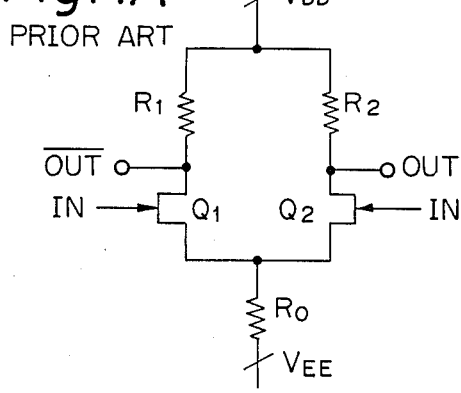
FIGS. 1A, 1B, and 1C are circuit diagrams of examples of conventional differential amplifier circuits; respectively.

FIG. 1A shows a basic type of conventional FET differential amplifier circuit which is formed by transistors $Q_1$, $Q_2$ as a differential pair, load resistors $R_1$ and $R_2$, and a resistor $R_0$. $V_{DD}$ is a high potential source add $V_{EE}$ is a low potential source.

Figure 1B:
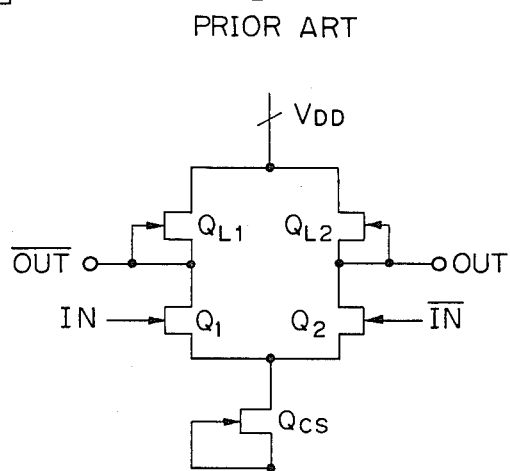

However, in such a circuit, a sufficient voltage gain cannot be obtained because of the load resistors. Therefore, to improve voltage gain, a circuit has been proposed as shown in FIG. 1B, wherein the load elements and the current source are replaced by constant current type FETs, $Q_{L1}$, $Q_{L2}$ and $Q_{CS}$, in which a short-circuit is made between the gate and the source.

However, this circuit has the drawbacks discussed in the previous section.

Figure 1C:
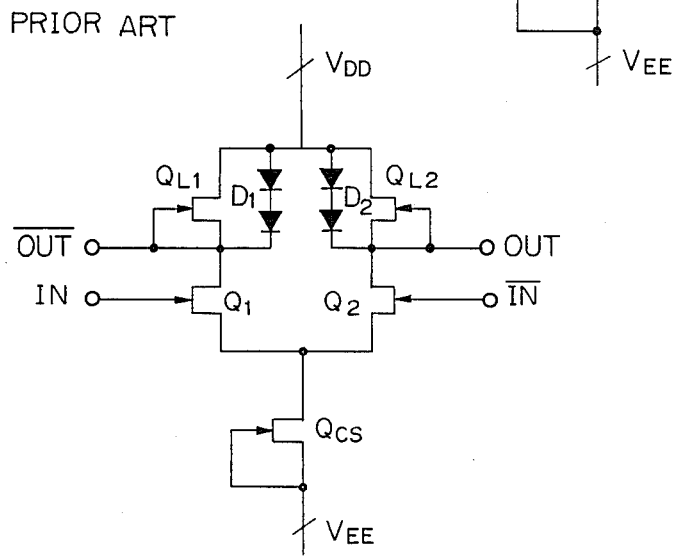

Therefore, to solve this problem, the circuit as shown in FIG. 1C has been proposed, wherein both ends of the load FETs $Q_{L1}$, $Q_{L2}$ are clamped by diodes $D_1$, $D_2$, to obtain a stable operation.

However, this clamping by the diodes, as already mentioned, provokes new problems, such as a large temperature characteristic at a low output level, and a deterioration in the AC characteristic.

In the present invention, to increase the voltage gain of the differential circuit, a constant current type FET in which a gate and a source are short-circuited, is used as a load element and a current source, and an FET clamp is used instead of the above-mentioned diode clamp.

Figure 2:
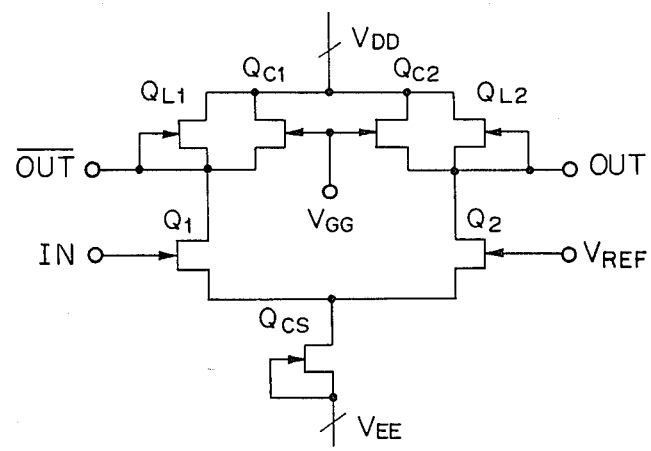
FIG. 2 is a circuit diagram of one embodiment of the differential amplifier circuit according to the present invention.

FIG. 2 shows a differential amplifier basic circuit of one embodiment of the present invention. As in the case shown in FIG. 1C, the load element and the current source of the differential amplifier circuit is replaced by a constant current type FETs $Q_{L1}$, $Q_{L2}$ and $Q_{CS}$ in which the source and the gate are short-circuited. In FIG. 2 the same symbols are used to denote the same portions shown in FIG. 1. Further, FETs (hereinafter called a clamp FETs) $Q_{C1}$, $Q_{C2}$ as a clamping element are provided between the source and the drain of the constant current type FETs $Q_{L1}$, $Q_{L2}$ as load element. Each clamp FET is used to operate the FET having a gate connected to a reference electric potential $V_{GG}$ as a constant voltage source. Further, in this case, an input is connected to a gate of one drive FET $Q_1$ of a differential pair, and a suitable reference voltage $V_{REF}$ is applied to a gate of another drive FET $Q_2$ to obtain an output OUT and an output $\overline{OUT}$. Note that this may be also applied to an inverse signal of the input IN.

Figure 4A:
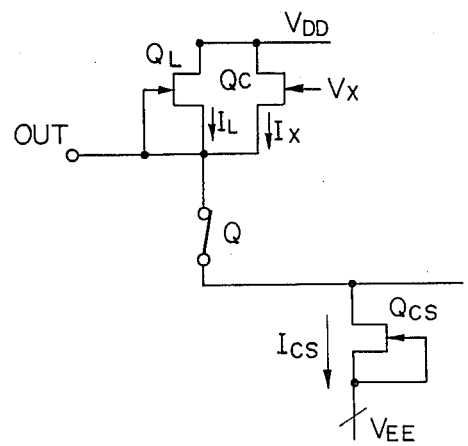
FIGS. 4A to 4C are diagrams explaining an analysis of the differential amplifier circuit according to the embodiment of the present invention.
Figure 4B:
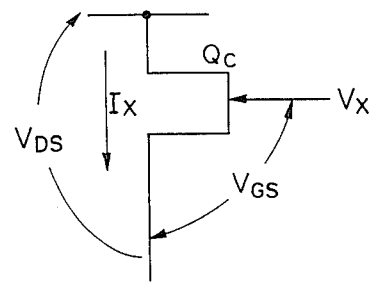

The condition wherein stable circuit operation can be obtained by a constant voltage type operation of the FETs $Q_{C1}$, $Q_{C2}$ will be described. To assist with this analysis, FIG. 4A shows a partial circuit of the differential amplifier circuit of one embodiment of the present invention, wherein the load FET is designated as $Q_L$, the clamp FET as $Q_C$, and the drive FET as Q. Further FIG. 4B shows the transistor $Q_C$ used as the clamp FET, and FIG. 4C shows the voltage vs current characteristic of the drive FET $Q_L$ and the clamp FET $Q_C$.

Figure 4C:
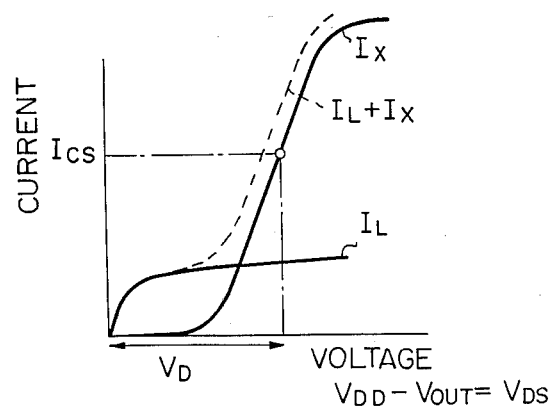

In FIG. 4C, an abscissa shows the difference in the voltages between the output OUT and the supply voltage $V_{DD}$, and the ordinate shows the current $I_L$ in the FET $Q_L$ and in $I_X$ between the source and the drain of $Q_L$ and $Q_C$ when the drive FET Q is made ON and the current flows to a differential side. When the current $I_L$ flows in the FET $Q_L$ as the load element, since the source and the drain thereof are commonly connected, the drive FET Q is made ON and the voltage of the output OUT is lowered, and when the voltage difference between the power source and the output is increased, the constant current characteristic as shown in FIG. 4C is obtained. On the other hand, since the gate voltage is fixed to $V_X$, the current of the clamp FET $Q_C$ is suddenly increased at a region where the gate/source voltage rises beyond the threshold value $V_{th}$ of $Q_C$, to obtain the constant voltage characteristic region. The voltage/current characteristic of a parallel circuit of the FETs $Q_L$ and $Q_C$ becomes as shown by the broken line obtained by combining these two characteristics, so that the constant voltage operation region appears. Then, as shown in the drawing, if the $I_{CS}$ of the current source of this differential pair enter a constant voltage region of the parallel circuit of $Q_L$, $Q_C$, the output voltage, i.e., the low level output, can be clamped at a value smaller by $V_D$ than the power source. However, in the case of a MESFET, for example, the gate/source voltage is restricted at a voltage $V_F$ by which the Schottky junction of the gate is made ON, so that the current is saturated. Therefore, the constant voltage characteristic region of the parallel circuit of $Q_L$, $Q_C$ appears only at the side lower than the ON voltage $V_F$ of the Schottky of the clamp FET $Q_C$. Therefore, for the functioning of the clamp FET $Q_C$ in the circuit shown in FIG. 4A, the following condition should first be satisfied:

$$I_L < I_{CS} \tag{1}$$

Next, the condition in which the gate/source voltage of the FET clamp is at a maximum is that corresponding to the ON voltage $V_F$ of the Schottky junction of the gate of the MESFET: that is, $$I_L + I_X(V_F) > I_{CS} \tag{2}$$

wherein $I_X(V_F)$ is a current which flows between the source/drain when the ON voltage $V_F$ of the Schottky junction is applied to a gate of the MESFET of the FET clamp. The existence of these two conditions, allows the output level to be clamped at a crosspoint of the $I_{CS}$ and the combined characteristic curve (constant voltage region) is obtained. That is, when another of the differential pair is completely cut off and all $I_{CS}$ of the current source flow in this differential pair, the current $I_L$ of the load FET $Q_L$ becomes constant and a remaining current flows in the clamp FET $Q_C$, whereby the low level output is clamped at a level $V_D$ at a cross point with the constant voltage region of the characteristic curve. The adjustment for satisfying the above-mentioned conditions (1) and (2) is carried out by adjusting the circuit constant of the differential amplifier circuit, for example, the gate width of three FET's (a drive FET Q, a load FET $Q_L$, and a clamp FET $Q_C$).

Figure 3:
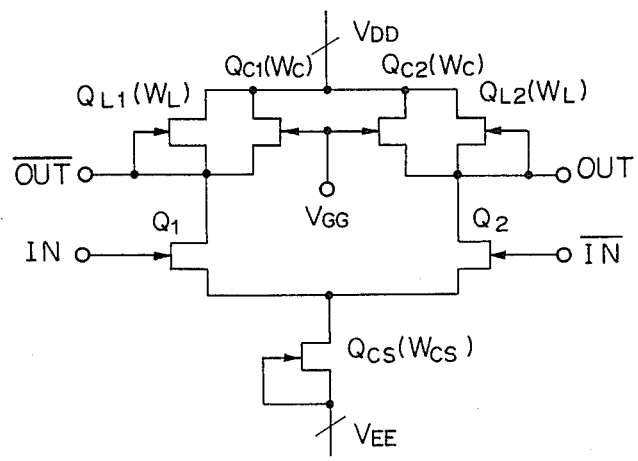
FIG. 3 is a circuit diagram of another embodiment of the differential amplifier circuit according to the present invention.

Next, FIG. 3 shows another embodiment of the differential amplifier circuit according to the present invention. This embodiment is different from FIG. 2 in that a differential input IN is applied. Further, in the circuits of FIG. 1 and FIG. 2, the load FETs $Q_{L1}$, $Q_{L2}$, the clamp FET $Q_{C1}$, $Q_{C2}$, and the constant current source FET $Q_{CS}$ are manufactured by the same process, have a similar distribution of impurities and have the same value of $V_{TH}$, K value and gate length, and only the gate width is different. In this embodiment, when the gate width of the load FETs $Q_{L1}$, $Q_{L2}$ is designated as $W_L$, the gate width of the clamp FETs $Q_{C1}$, $Q_{C2}$ as $W_C$, and the gate width of the constant current source FET $Q_{CS}$ as $W_{CS}$, the following condition occurs, $$W_{CS} = W_L + W_C \tag{3}$$

By setting this condition, the low level output can be made the same level as the gate potential $V_{GG}$ of the clamp FET $Q_C$.

Figure 5:
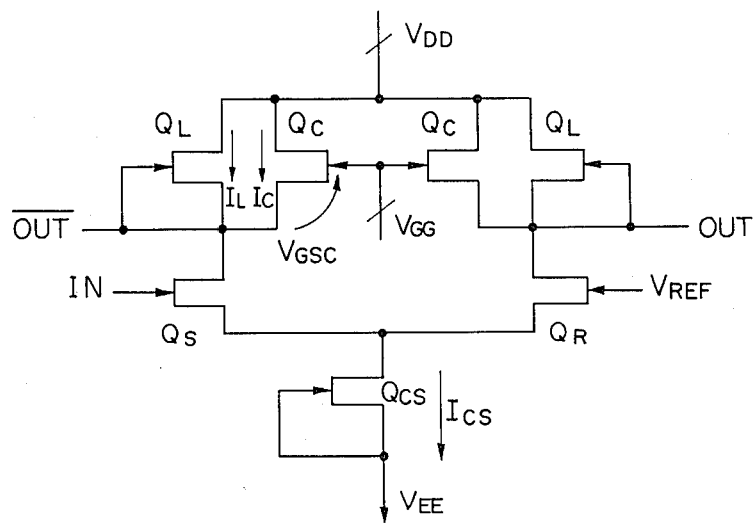
FIG. 5 is a diagram of the circuit in the embodiment of the present invention used for analysis in which an output low level is clamped to $V_{GG}$.

Hereinafter, this condition (3) will be described with reference to the differential amplifier circuit shown in FIG. 5 and FIGS. 6A and 6C. Here, the drive FETs are designated as $Q_S$, $Q_R$, the load FETs as $Q_L$, $Q_L$, the clamp FETs as $Q_C$, a high level source as $V_{DD}$, and a low level source as $V_{EE}$ (1) High level output When the drive FET $Q_S$ or $Q_R$ is made completely OFF, the OUT signal rises to the $V_{DD}$ level.

Therefore, the high level output satisfies $$V_{OH} = V_{DD}.$$

(2) Low level output

When the drive FET $Q_S$ or $Q_R$ is made completely OFF and $Q_{CS}$, $Q_L$, and $Q_C$ are saturated, $$I_L = K_L \cdot W_L \cdot (-V_{thL})$$

but if $Q_L$ and $Q_{CS}$ have the same characteristic, the above equation can be changed as follows, $$I_L = K_{CS} \cdot W_L \cdot (-V_{thCS})^2$$

and the current of the clamp FET becomes $$I_C = K_C \cdot W_C \cdot (V_{GSC} - V_{thC})^2 = K_C \cdot W_C \cdot (V_{GG} - V_{OL} - V_{thC})^2$$

and the current of the current source FET $Q_{CS}$ becomes $$I_{CS} = K_{CS} \cdot W_{CS} \cdot (-V_{thCS})^2$$

Wherein $K_L$, $K_{CS}$, and $K_C$ are the value of K of each FET; $V_{thL}$, $V_{thC}$, and $V_{thCS}$ are the threshold value of each FET; and $W_L$, $W_C$, and $V_{CS}$ are the gate width of each FET.

When the current is set as $$I_{CS} = I_L + I_C$$

and solved by $V_{OL}$, $$V_{OL} = V_{thCS} \sqrt{\frac{K_{CS}}{K_C} \cdot \frac{W_{CS} - W_L}{W_C}} + V_{GG} - V_{thC}$$

If the setting is $V_{thCS} = V_{thL} = V_{thC}$, $K_{CS} = K_L = K_C$ and $W_{CS} - W_L = W_C$ for each transistor, the low level output becomes $$V_{OL} = V_{GG} \quad (4)$$

That is, when the K value and $V_{th}$ of the load FET $Q_L$, clamp FET $Q_C$, and the current source FET $Q_{CS}$ of the differential circuit are made equal, and the sum of the gate width $W_L$ of the load FET $Q_L$ and the gate width $W_C$ is made equal to the gate width $W_{CS}$ of the current source of the differential amplifier circuit, the voltage $V_{GG}$ supplied to the gate of the clamp FET appears as the low level output.

The operation of the differential amplifier circuit in the embodiment of the present invention described above may be stabilized by combining the circuits shown in FIG. 2 and FIG. 3. That is, in the circuit shown in FIG. 3, when the circuit for generating the reference voltage $V_{REF}$ and the clamp level (low level output) $V_{GG}$ is designed by bringing the inverse signal of the input signal IN of the gate of the driving FET $Q_2$ to the reference voltage $V_{REF}$, as shown in FIG. 2, if the variations $\delta V_{GG}$, $\delta V_{REF}$ due to variations in the temperature and the parameter between the gate potential $V_{GG}$ of the clamp FET $Q_{C1}$, $Q_{C2}$ and the $V_{REF}$ is as shown below:

$$\frac{\delta V_{GG}}{2} = \delta V_{REF}$$

the $V_{REF}$, which is the threshold value of the differential amplifier circuit, can be placed midway between the high level $V_{DD}$ and the low level $V_{GG}$, thus preventing a decrease of the noise margin and realizing a stable operation.

Figure 7A:
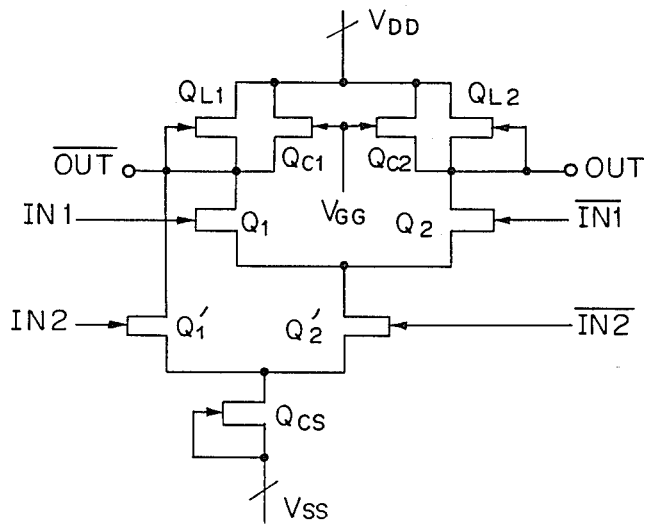
FIGS. 7A and 7B are circuit diagrams of the differential circuit when the present invention is applied to a logic construction similar to a conventional CML.
Figure 7B:
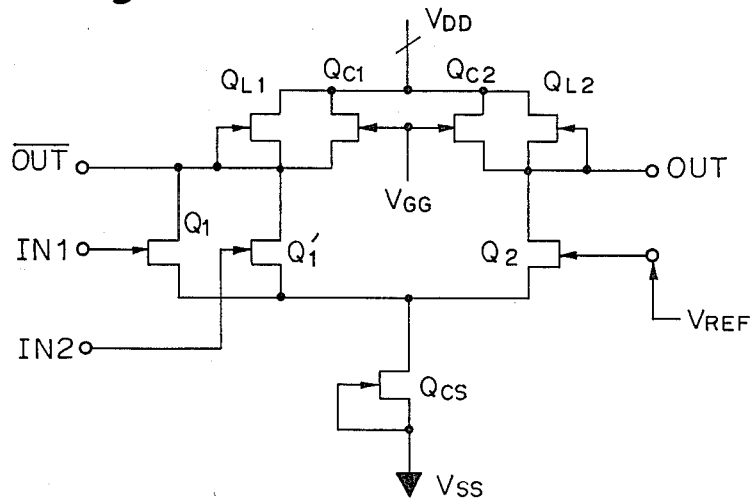

Further, in addition to the embodiment shown above, a logic construction similar to a conventional CML (current mode logic) may be possible, and an example of a circuit (NOR circuit) having two inputs $IN_1$, $IN_2$ is shown in FIGS. 7A and 7B, wherein portions corresponding to those in FIG. 2 and FIG. 3 are denoted by the same symbols or the same symbol with a prime ['].

Further, although in the NOR construction the drive FET $Q_1$, $Q'_1$ ... is arranged in parallel, a series gate construction may be realized.

The application of the present invention will be now explained.

Figure 8:
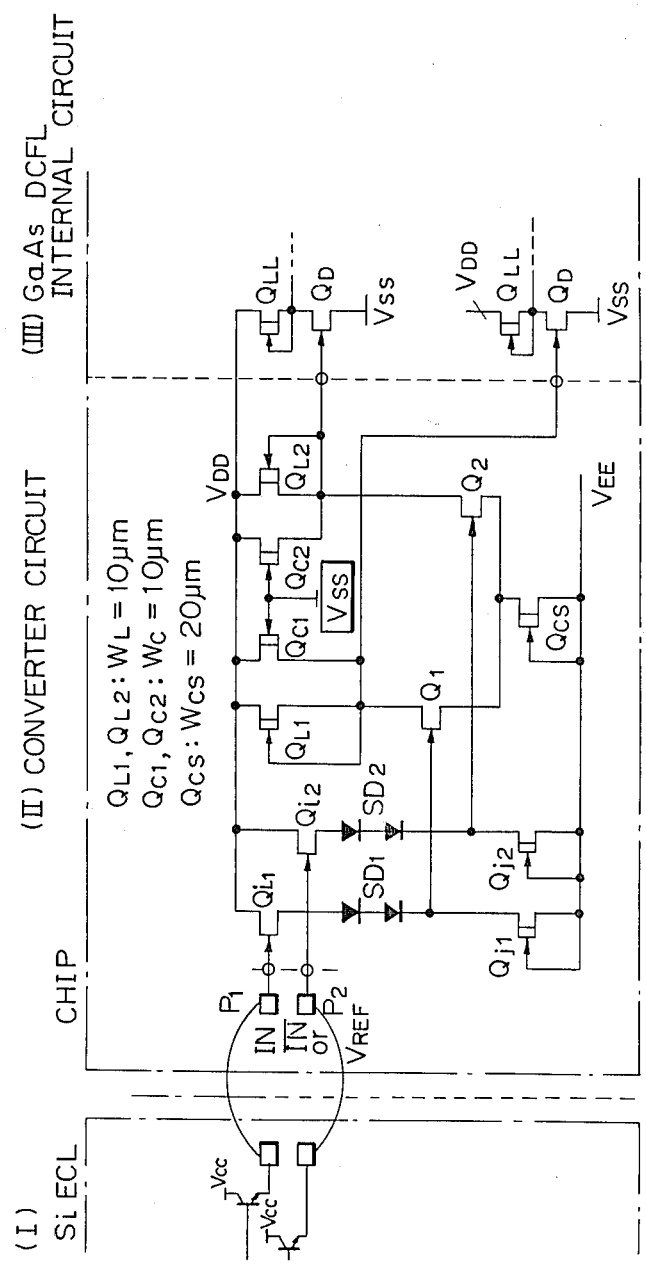

FIG. 8 shows a circuit to which the present invention is applied, which the ECL level is converted by using an Si substrate to a GaAs DCFL (direct-coupled FET logic) level.

In the DCFL of GaAs, $V_{SS}$ is the reference voltage of the logic, and thus when $V_{SS}$ is varied, the internal level is changed. On the other hand, in the SiECL, $V_{DD}$ not $V_{SS}$ is used as the logic reference, and thus even if $V_{SS}$ is varied, the internal logic level is not changed.

For example, in Si ECL,
$V_{cc} = 0$
"H" level → −0.5 or −0.8V
"L" level −1.8V in GaAs DCFL, $V_{DD} = 0$, $V_{EE} = -3.6V$, $V_{SS} = -2.0V$.

Therefore, when the Si integrated circuit and DCFL are connected, a converter circuit must be provided so that a complete interface is obtained by making the input low level from the SiECL following the change of the $V_{SS}$ level in the GaAs DCFL. FIG. 8 is a diagram of the converter circuit which is realized by applying a differential amplifier circuit according to the present invention. In FIG. 8, (I) denotes SiECL and (II) the converter circuit to which the differential amplifier circuit according to the present invention is applied. Further, (III) is a GaAs DCFL internal circuit, and a load GaAs FET $Q_{LL}$ and a drive FET $Q_D$ are shown as one part thereof. $P_1$, $P_2$ designate an output terminal of SiECL, and a differential input IN, and an inverse signal thereof $\overline{IN}$ or a reference voltage $V_{REF}$ are output from the SiECL and are input to gates of the FETs $Q_{i1}$ and $Q_{i2}$ of the input circuit of the converter circuit. This input circuit is formed by the FETs $Q_{i1}$, $Q_{i2}$, level shift diodes $S_{D1}$, $S_{D2}$, and current sources $Q_{j1}$, $Q_{j2}$, and the input signals are shifted via the diodes $S_{D1}$ and $S_{D2}$ and applied to the gates of the drive FETs $Q_1$ and $Q_2$ of the differential amplifier circuit, as in the embodiment described previously. $V_{SS}$ ($V_{SS}$ of DCFL) is applied to the gates of the clamp FETs $Q_{C1}$ and $Q_{C2}$ of the differential amplifier circuit.

The signal level passed through the differential amplifier circuit rises to $V_{DD}$ in the high level. On the other hand, the low level is clamped and output at a level which is determined by the $V_{SS}$ applied to the gates of $Q_{C1}$, $Q_{C2}$ and a circuit constant of each FET of the differential amplifier circuit. Then, if the circuit constant is suitably determined and the output low level is clamped by $V_{SS}$, DCFL may be driven by the SiECL level. The condition satisfying the above equation (3) with reference to FIG. 3, may be the gate width ($W_{CS}$) of the current source FET = the sum ($W_L + W_C$) of the gate width of the load FET, and the gate width of the clamp FET.

For example, $W_L + W_C W_{CS} = 10 + 10 - 20$ or $15 + 5 - 20$.

Figure 9:
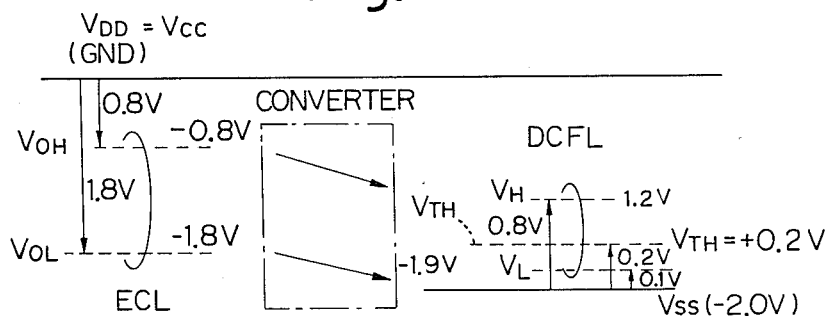
FIGS. 8 and 9 are diagrams for converting the SiECL level in the application of the present invention to the GaAs DCFL level and BFL level.

FIG. 9 shows a relationship between the logic level in the SiECL and the GaAs DCFL. That is, in the SiECL circuit, the voltage $V_{DD}$ (ground) is used as the reference circuit and $V_{OH}$ and $V_{OL}$ use $-0.8V$ and $-1.8V$, respectively, as the logic high level and the logic low level. In the GaAs DCFL, the low level output of the converter circuit is clamped by a reference level $V_{SS}$ and the threshold level $V_{TH}$ (+0.2V to $V_{SS}$) of the drive FET $Q_D$ is set based on the reference voltage $V_{SS}$. Then, if the reference voltage $V_{SS}$ decreases or increases, the low level follows the increase or decrease of the reference voltage $V_{SS}$, and therefore the internal logic does not change. If the condition of the equation (3) as already mentioned is satisfied, the output low level $V_L$ can be made equal to the reference level $V_{SS}$.

Figure 10:
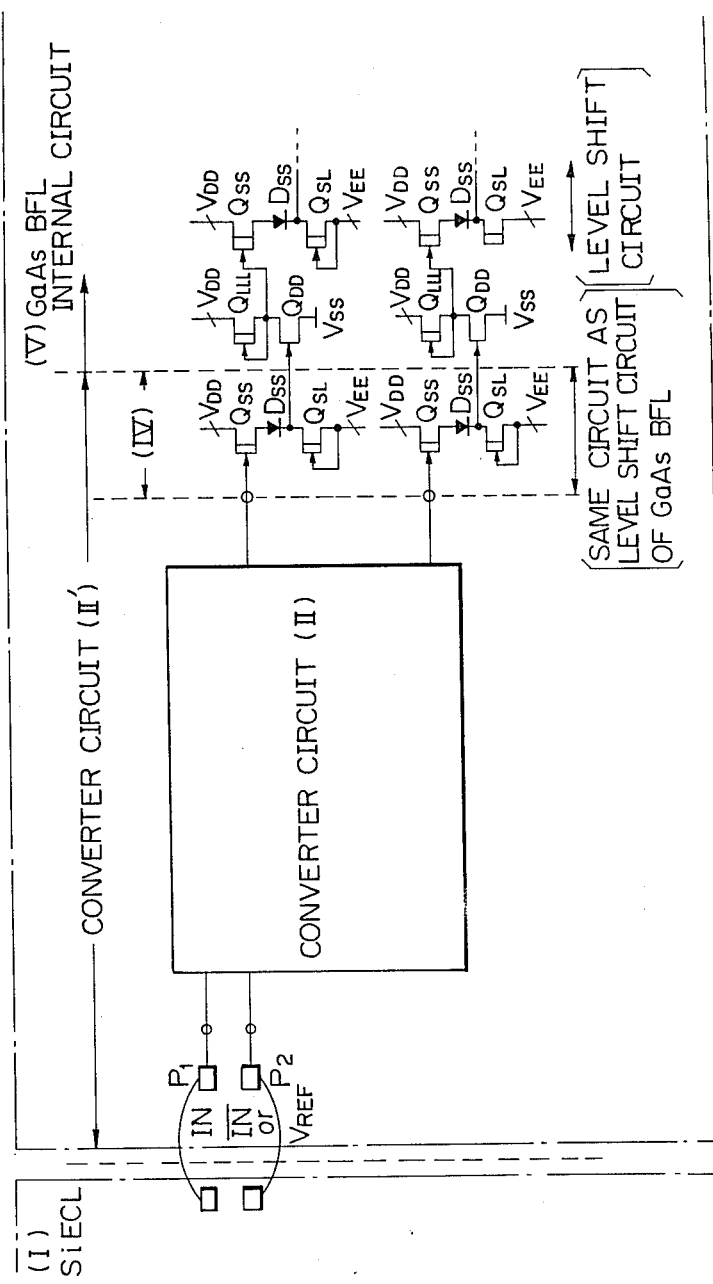
FIG. 10 is a level diagram for the circuit shown in FIG. 8.

Next, an embodiment of another application of the present invention will be described with reference to FIG. 10. This is a circuit for converting the SiECL level to GaAs BFL (buffered FET logic). The symbols used for each portion are the same symbols used for the same portions in FIG. 8. This is a converter circuit (II') which is formed by adding the level shift circuit (IV) (the same current as the level shift circuit of the GaAs BFL internal circuit), to the same circuit as the converter circuit (II) for the DCFL level in FIG. 8. In FIG. 10, as a portion of the GaAs BFL internal circuit, a gate circuit formed by a drive FET $Q_{LLL}$, a drive FET $Q_{DD}$, and a level shift circuit which is formed by an FET $Q_{SS}$, diode $D_{SS}$ and a current source FET $Q_{SL}$ to convert the output level of the gate circuit, are shown representatively. The BFL is different in that the level shift circuit is provided at the output of the DCFL. In DCFL, if the $V_{th}$ of the drive FET is not (+), switching can not be carried out when the low level is applied to the input, but in BFL, even if the $V_{th}$ of the drive FET is (−), switching is possible because the level shift is carried out by the buffer. This is an advantage in that, in a GaAs IC, when the $V_{th}$ is (−), it is easier to manufacture. The difference in operation is that, in DCFL, the output falls until $V_{OL} = V_{SS}$ when the drive FET is made ON. On the other hand, in the BFL, when the drive FET is made ON, the level in the former stage also falls to $V_{SS}$. However, as the threshold value of the drive FET is (−), then to make the FET OFF, the low level is made (−) and lower than the threshold value of the drive FET, via the level shift circuit. Therefore, as shown in FIG. 10, the low level output is clamped by the converter circuit (II) to $V_{SS}$ and is output, and this low level is applied to the level shift circuit (IV) by which the low level is made (−) and lower than the threshold value $V_{th}$ of the drive FET, to turn OFF the drive FET (the threshold value $V_{th}$ is (−)).

According to the present invention, a similar operation to that of the conventional diode clamp can be realized by the constant voltage type FET, so that the problem occurring in the diode clamp type differential amplifier circuit, that is, the temperature characteristic and the deterioration of the AC characteristic, can be solved, by the following actions.

(1) Temperature characteristic

As the FET level clamp is not used, the temperature characteristic is not received. Furthermore, the temperature characteristics of the I-V curves of the constant current FET and the FET level clamp are exactly the same, and therefore an advantage is obtained in that the temperature characteristic of the clamp level is cancelled.

(2) AC characteristics

The capacitances between a source and a drain of the FET and between a gate and a source of the FET are very small when compared to those of the diode, and thus the deterioration of the AC characteristic can be considerably reduced.

I claim:

1. A differential circuit, coupled to a low voltage power source and a high voltage power source, comprising:
    a first drive FET and a second drive FET each having a gate connected to an input, having a drain, and having a source, the sources of said first drive FET and said second drive FET being commonly connected at a node;
    a constant current FET connected between the node and the low voltage power source;
    a first load circuit provided between the drain of said first drive FET and the high voltage power source;
    a second load circuit provided between the drain of said second drive FET and the high voltage power source;
    each of said first and second load circuits being formed by a first load FET having a drain connected to the high voltage power source, and having a gate and a source which are short-circuited and connected to the drain of the corresponding one of said first and second drive FETs, and a second load FET having a drain connected to the high voltage power source, having a source connected to the dran of the corresponding one of said first and second drive FETs and having a gate with a constant voltage applied thereto; and
    output terminals connected to the drains of said first drive FET and said second drive FET, respectively.

2. A differential circuit according to claim 1, wherein said first load FET, said second load FET, and said constant current FET have a substantially equal K value and $V_{th}$, and wherein the sum of gate widths of said first load FET and said second load FET is substantially equal to a gate width of said constant current FET.

3. A differential circuit according to claim 1, wherein said FET's are formed by a MESFET.

4. An integrated circuit device comprising:
    a high voltage power source;
    a low voltage power source;
    an intermediate voltage power source between said high voltage power source and said low voltage power source;
    input terminals;
    a converter circuit coupled to said input terminals, including:
    first and second drive FETs, each having a gate connected to a corresponding one of said input terminals, having a drain and having a source, the sources of said first drive FET and said second drive FET being commonly connected at a node;
    a constant current FET connected between the node and said low voltage power source;
    a first load circuit provided between the drain of said first drive FET and said high voltage power source;

a second load circuit provided between the drain of said second drive FET and said high voltage power source;

each of said first and second load circuits being formed by a first load FET having a drain connected to said high voltage power source, and having a gate and a source which are short-circuited and connected to the drain of the corresponding one of said first and second drive FETs, and a second load FET having a drain connected to said high voltage power source, having a source connected to the drain of the corresponding one of said first and second drive FETs and having a gate with said intermediate voltage applied thereto;

output terminals connected to the drains of said first drive FET and said second drive FET;

an internal circuit provided between said high voltage power source and said intermediate voltage power source and having a third load FET and a third drive FET in series, and of said output terminals of said converter circuit being connected to the gate of said third drive FET in said internal circuit.

5. An integrated circuit device according to claim 4, further comprising a level shift circuit provided between the output terminals of said converter circuit and the gate of said third drive FET of said internal circuit.

6. An integrated circuit device according to claim 5, wherein the input terminals are coupled to receive ECL level signals, and wherein said internal circuit is a GaAs BFL internal circuit.

7. An integrated circuit device according to claim 4, wherein the input terminals are coupled to receive ECL level signals, and wherein said internal circuit is a GaAs DCFL internal circuit.

* * * * *